US006603342B2

(12) United States Patent
Liao et al.

(10) Patent No.: US 6,603,342 B2
(45) Date of Patent: Aug. 5, 2003

(54) LIGHT EMITTING ELEMENT DRIVER WITH LOW SUPPLY VOLTAGE

(75) Inventors: Tai-Shan Liao, Hsinchu (TW); Ming-Li Chen, Hsinchu (TW); Ming Hung Huang, Hsinchu (TW); Ho-Lin Tsay, Hsinchu (TW)

(73) Assignee: Precision Instrument Development Ctr., National Science Council, Hsinchu (TW)

( * ) Notice: Subject to any disclaimer, the term of this patent is extended or adjusted under 35 U.S.C. 154(b) by 59 days.

(21) Appl. No.: 09/977,327

(22) Filed: Oct. 16, 2001

(65) Prior Publication Data

US 2003/0057883 A1 Mar. 27, 2003

(30) Foreign Application Priority Data

Aug. 23, 2001 (TW) ...................................... 90214491 U

(51) Int. Cl.[7] ........................... H03K 17/60; H01J 1/60; G08B 5/00; G09G 3/32

(52) U.S. Cl. ........................ 327/487; 327/485; 327/483; 327/478; 315/136; 315/129; 315/362; 315/363; 340/815.4; 340/815.45; 345/82; 345/84; 345/212

(58) Field of Search ................................ 315/134, 136, 315/362, 363, 129; 340/782, 762, 815.46, 815.4, 815.45; 327/485, 483, 486–492, 478; 345/82, 84, 212, 213, 46

(56) References Cited

U.S. PATENT DOCUMENTS 3,965,372 A * 6/1976 Levine ....................... 327/482
4,769,621 A * 9/1988 Kipnis .................... 331/117 R
4,866,430 A * 9/1989 Chek ........................... 345/82

OTHER PUBLICATIONS

"Generating Nested Pulses"; John A. Haase; Electronic Design, 522; Mar. 7, 1994.

"A simple circuit for driving light–emitting diodes with low supply voltage"; Tai–Shan Liao and Chun–Ming Chang; Review of Scientific Instruments, vol. 71, No. 3; Mar. 2000; pp. 1569–1570; 2000 American Institute of Physics.

"An ultralow supply voltage circuit for driving blue light emitting diodes"; Tai–Shan Liao; Review of Scientific Instruments; vol. 71, No. 9; Sep. 2000; pp. 3595–3596; 2000 American Institute of Physics.

"A novel simplified laser diode driver"; Chun–Ming Chang; Review of Scientific Instruments; vol. 72, No. 2; Feb. 2001; pp. 1583–1584; 2001 American Institute of Physics.

* cited by examiner

*Primary Examiner*—Dong Wong
*Assistant Examiner*—Tuyet T. Vo
(74) *Attorney, Agent, or Firm*—Bacon & Thomas, PLLC

(57) ABSTRACT

A light emitting element driver composed of two transistors, one ground resistor, one inductance and a single capacitor is arranged to drive an LED with a supplied voltage as low as about 0.92 V. The transistors include an NPN transistor and a PNP transistor, the base of the PNP transistor being connected to the ground resistor and the base of the NPN transistor being connected to the collector of the PNP transistor, with the capacitor being connected between the base of the PNP transistor and the node connecting the collector of the NPN transistor to the inductance and to the LED.

3 Claims, 1 Drawing Sheet

LIGHT EMITTING ELEMENT DRIVER WITH LOW SUPPLY VOLTAGE

FIELD OF THE INVENTION

The present invention is related to a light emitting element driver with a low supply voltage, and in particular to a light emitting element driver with a low supply voltage by using two transistors, one ground resistor, one inductance and one capacitor.

BACKGROUND OF THE INVENTION

There were driver circuits developed for light emitting elements having a low supply voltage [A. L. Belousov, Electronic Design, March, p. 75 (1994); T. S. Liao and C. M. Chang, Rev. Sci. Instrum. 71, 1569 (2000); T. S. Liao and C. M. Chang, Rev. Sci. Instrum. 71, 3595 (2000)]; however, these driver circuits require many transistors or an integrated circuit chip. In 2001, a light emitting element driver with a low supply voltage by using two transistors, one ground resistor, one inductance and one capacitor was invented by one of co-inventors of the present application and his co-worker [C. M. Chang and T. S. Liao, Rev. Sci. Instrum. 72, 1583 (2001)], the disclosure of which is incorporated herein by reference. To our knowledge, the light emitting element driver with a low supply voltage shown in this article [C. M. Chang and T. S. Liao, Rev. Sci. Instrum. 72, 1583 (2001)] has the fewest number of elements among the prior art driver circuits having no transformer; however, it still requires at least about 1.4 V to drive the light emitting element. It is apparent that a driving voltage lower than 1.0 V will render the light emitting element more efficient economically.

SUMMARY OF THE INVENTION

An object of the present invention is to provide a light emitting element driver with a low supply voltage, which has a driving voltage lower than about 1.0 V and thus has an enhanced economical efficiency.

In order to accomplish the object of the present invention a light emitting element driver with a low supply voltage constructed according to the present invention comprises two transistors (one NPN transistor and one PNP transistor), one ground resistor, one inductance and one capacitor. The collector of the PNP transistor is connected to the base of the NPN transistor, and the collector of NPN transistor and the base of the PNP transistor are connected with the capacitor. The ground resistor for bias is connected to a first node tying the base of the PNP transistor and the capacitor. The emitter of the PNP transistor is adapted to be connected to a power. The emitter of NPN transistor is grounded. One end of the inductance is adapted to be connected to the power, and another end thereof is connected to the collector of the NPN transistor, so that the inductance is affected by a self-excited oscillation of the light emitting element driver when the power is supplied to the light emitting element driver, and thus a voltage amplification is generated at a second node connecting the inductance and the collector of the NPN transistor with a very low working voltage of the power, whereby a light emitting element connected to the second node is able to be driven.

Preferably, the light emitting element driver of the present invention further comprises the light emitting element such as a LED or a laser diode.

DETAILED DESCRIPTION OF THE PREFERRED EMBODIMENT

Figure 1:
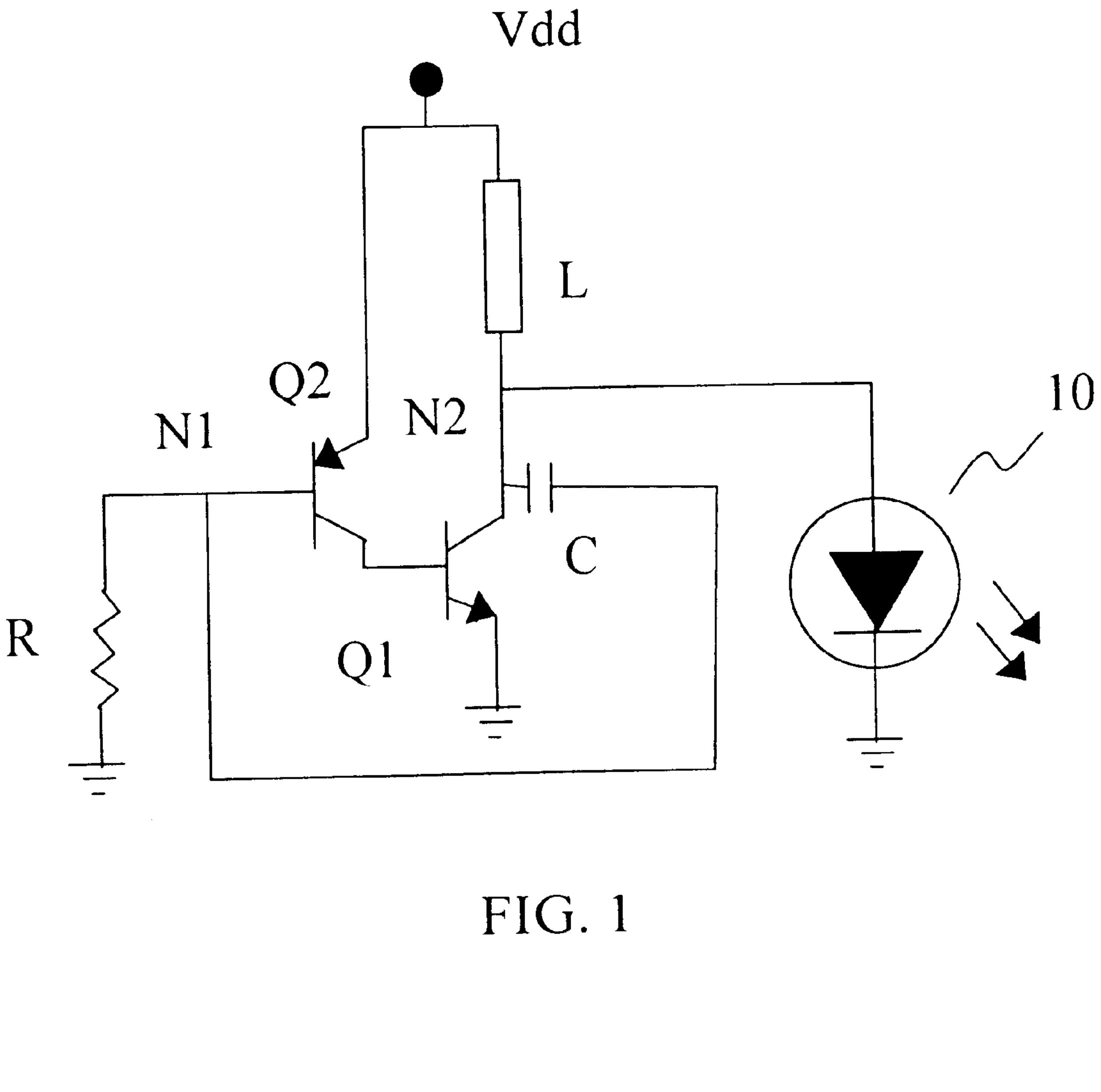
FIG. 1 shows a circuitry of the light emitting element driver with a low supply voltage constructed according to one of the preferred embodiments of the present invention.

Referring to FIG. 1, a light emitting element driver with a low supply voltage constructed according to one of the preferred embodiments of the present invention comprises two transistors (one NPN transistor Q1 and one PNP transistor Q2), one ground resistor R, one inductance L and one capacitor C. The collector of the PNP transistor Q2 is connected to the base of the NPN transistor Q1, and the collector of NPN transistor Q1 and the base of the PNP transistor Q2 are connected with the capacitor C. The ground resistor R for bias is connected to a first node N1 tying the base of the PNP transistor Q2 and the capacitor C. The emitter of the PNP transistor Q2 is connected to a power Vdd. The emitter of NPN transistor Q1 is connected a power ground. One end of the inductance L is connected to the power Vdd, and another end thereof is connected to the collector of the NPN transistor Q1, so that the inductance L is affected by a self-excited oscillation of the light emitting element driver, and thus a voltage amplification is generated at a second node N2 connecting the inductance L and the collector of the NPN transistor Q1 with a very low working voltage of the power Vdd, whereby a laser diode or a LED 10 with one end thereof connected to the second node N2 and another end thereof grounded is able to be driven. The light emitting element driver of this preferred embodiment of the present invention was able to drive a light emitting element with a voltage of the power as low as about 0.92 V, and thus significantly enhances a range of the dynamic working voltage of the power.

It is apparent to people ordinarily skilled in the art that the present invention includes a light emitting element driver constructed according to the aforesaid preferred embodiment but with opposite polarities of the transistors.

What is claimed is:

1. A light emitting element driver with a low supply voltage comprising one NPN transistor, one PNP transistor, one ground resistor, one inductance, and only one capacitor, wherein a collector of the PNP transistor is connected directly to a base of the NPN transistor, and a collector of the NPN transistor and a base of the PNP transistor are connected with the capacitor, the ground resistor is connected to a first node typing the base of the PNP transistor and the capacitor;

an emitter of the PNP transistor is adapted to be connected to a power supply, and an emitter of the NPN transistor is grounded; and one end of the inductance is adapted to be connected to the power supply, and another end thereof connected to the collector of the NPN transistor.

2. The light emitting element driver according to claim 1 further comprising a light emitting element, wherein one end of the light emitting element is connected to a second node connecting the inductance and the collector of the NPN transistor and another end thereof is grounded.

3. The light emitting element driver according to claim 1, wherein the light emitting element is an LED or a laser diode.

* * * * *